United States Patent
Huang et al.

(10) Patent No.: US 6,380,077 B1
(45) Date of Patent: Apr. 30, 2002

(54) METHOD OF FORMING CONTACT OPENING

(75) Inventors: I-Hsiung Huang, Kaohsiung; Jiunn-Ren Hwang, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/835,199

(22) Filed: Apr. 13, 2001

(51) Int. Cl.$^7$ ................................... H01L 21/4763
(52) U.S. Cl. ................................ 438/637; 438/629
(58) Field of Search ........................... 438/622, 623, 438/624, 629, 633, 634, 637, 638, 669, 717

(56) References Cited

U.S. PATENT DOCUMENTS 5,759,911 A * 6/1998 Cronin et al. ............... 438/622

\* cited by examiner

*Primary Examiner*—David Nelms
*Assistant Examiner*—David Nhu

(74) *Attorney, Agent, or Firm*—J.C. Patents

(57) ABSTRACT

A method of forming a contact opening. A substrate having a conductive structure and a dielectric layer thereon is provided. A first photoresist layer is formed over the dielectric layer. A first photo-exposure followed by a photoresist development is conducted so that an opening pattern on the photomask is transferred to the first photoresist layer. The first photoresist layer includes a first opening that exposes a portion of the dielectric layer. A second photoresist layer is formed over the patterned first photoresist layer. The photomask is shifted horizontally relative to the substrate. A second photo-exposure followed by a photoresist development is conducted so that the opening pattern on the photomask is transferred to the second photoresist layer. The second photoresist layer includes a second opening that exposes a portion of the first photoresist layer and a portion of the first opening. Thereafter, using the first and the second photoresist layer as a mask, a portion of the dielectric layer is removed until a contact opening that exposes a portion of the conductive structure is formed. The first and the second photoresist layer are then removed, followed by forming a glue layer over the substrate to conform with a profile of the contact opening. Finally, the contact opening is filled with a metal plug.

18 Claims, 3 Drawing Sheets

METHOD OF FORMING CONTACT OPENING

BACKGROUND OF THE INVENTION

1. Field of Invention

The present invention relates to a semiconductor manufacturing process. More particularly, the present invention relates to a method of forming a contact opening over a substrate.

2. Description of Related Art

Semiconductor manufacturing can be roughly divided into four modules, including diffusion, etching, thin film and photo-exposure. Photo-exposure is one of the steps in a photolithographic process. After photo-exposure, the pattern on a photomask is transferred to a silicon chip so that the etching module may be conducted to form an etching pattern or to provide a good implant pattern for the film module. Hence, accurate transfer of pattern in photolithographic process is critical to successful fabrication of semiconductor devices.

In photolithographic process, resolution of the exposure station and wavelength $\lambda$ of light source is related by the following formula:

$$R = K_1 \lambda / NA$$

where R is the resolution of the exposure station, $K_1$ is a constant related to the photoresist material and the processing conditions, and NA is the numeral aperture of the lens system used by the exposure station. According to the formula, resolution R provided by the exposure station is small when wavelength $\lambda$ of the light source is short. Similarly, when numerical aperture NA of the exposure station is large, resolution R provided by the exposure station is also small. To transfer a given pattern on a photomask to a photoresist layer accurately, the pattern projected by the exposure station must have a depth of focus (DOF) covering the entire thickness of the photoresist layer. Preferably, identical focusing is obtained at the upper surface of the photoresist layer and the surface close to the substrate. In general, DOF of an exposure station can be quantified using the formula:

$$DOF = K_2 \lambda / (NA)^2$$

To increase DOF of an exposure station, a light source having long wavelength and a lens system having a small numerical aperture is preferred. However, this presents a direct conflict with the demand for resolution.

Following recent increase in the level of integration for integrated circuits, photomask pattern is getting increasingly dense. Pitches between neighboring bit lines, word lines, doping regions and capacitors are all reduced. Consequently, an exposure station having a higher resolution is required to transfer such fine patterns. Yet, increasing the resolution of an exposure station leads to a loss of depth of focus. On the other hand, if depth of focus of an exposure station is increased to obtain a more accurate pattern transfer, resolution will be lowered. When deep sub-micron devices are manufactured, depth of focus and resolution are optimized by increasing the complexity of photolithographic process and lowering the working life of a photolithographic station. Additional photolithographic steps and planarizing processes are also introduced to reduce the problems encountered during processing, thereby leading to a higher overall production cost.

SUMMARY OF THE INVENTION

Accordingly, one object of the present invention is to provide a method of forming a contact opening. First, a substrate is provided. A conductive structure and a dielectric layer are sequentially formed over the substrate. A first photoresist layer is formed over the dielectric layer. The first photoresist layer is exposed to light through a photomask and then the exposed photoresist layer is developed so that opening pattern on the photomask is transferred to the first photoresist layer. Ultimately, a first opening that exposes a portion of the dielectric layer is formed in the first photoresist layer. A second photoresist layer is formed over the patterned first photoresist layer. A relative horizontal shifting between the substrate and the photomask is carried out so that the opening pattern on the photomask is above a portion of the first opening. A second photo-exposure is conducted using the photomask so that the opening pattern is transferred to the second photoresist layer. Consequently, a second opening that exposes a portion of the first photoresist layer and a portion of the first opening is formed in the second photoresist layer. Thereafter, using the first and the second photoresist layer as a mask, a portion of the dielectric layer is removed until a contact opening that exposes a portion of the conductive structure is formed. Finally, the first and the second photoresist layer are removed.

According to one embodiment of this invention, before forming the second photoresist layer, further includes forming a buffer layer over the substrate. The buffer layer includes a hydrophilic anti-reflection coating or a layer having a hydrophilic chemical structure. In addition, there is a positional shift of the second opening relative to the first opening. The positional shift has a magnitude smaller than dimension of the first opening.

Since there is a relative positional shift between the first and the second opening, and furthermore, the second opening exposes a portion of the first photoresist layer and a portion of the first opening, the extent of exposure of the dielectric layer by the second opening is smaller than the first opening. Hence, the photoresist opening exposes a smaller portion of the dielectric layer and size of the ultimately formed contact opening, formed using the first and the second photoresist layer as a mask, is reduced.

Furthermore, the presence of a first photoresist layer and the second photoresist layer is capable of preventing any mixing with the first photoresist layer when the second photoresist layer is formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
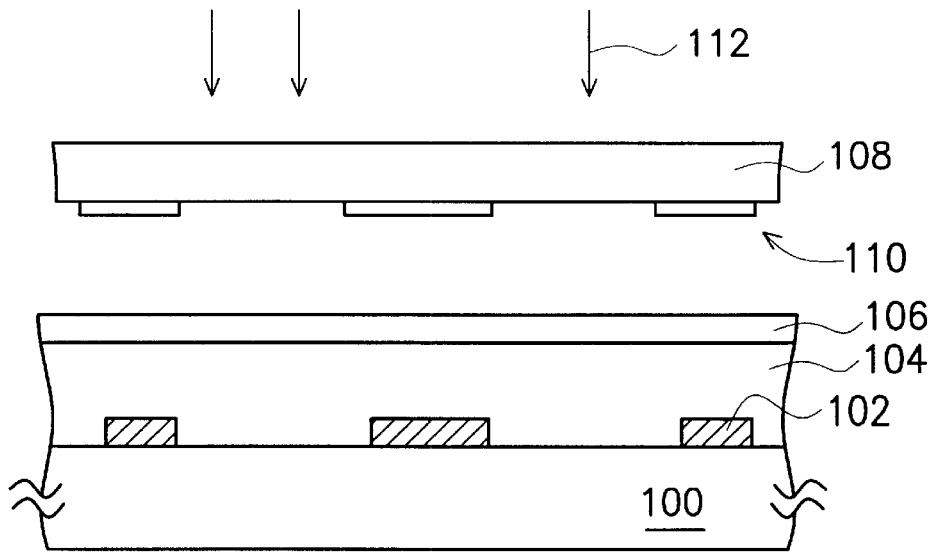
FIGS. 1A through 1E are schematic cross-sectional views showing the progression of steps for forming the contact opening according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic cross-sectional views showing the progression of steps for forming the contact opening according to one preferred embodiment of this invention.

As shown in FIG. 1A, a substrate 100 is first provided. A conductive structure 102 and a dielectric layer 104 are sequentially formed over the substrate 100. The dielectric layer 104 can be an oxide layer or a nitride layer formed, for example, by chemical vapor deposition.

Figure 1B:
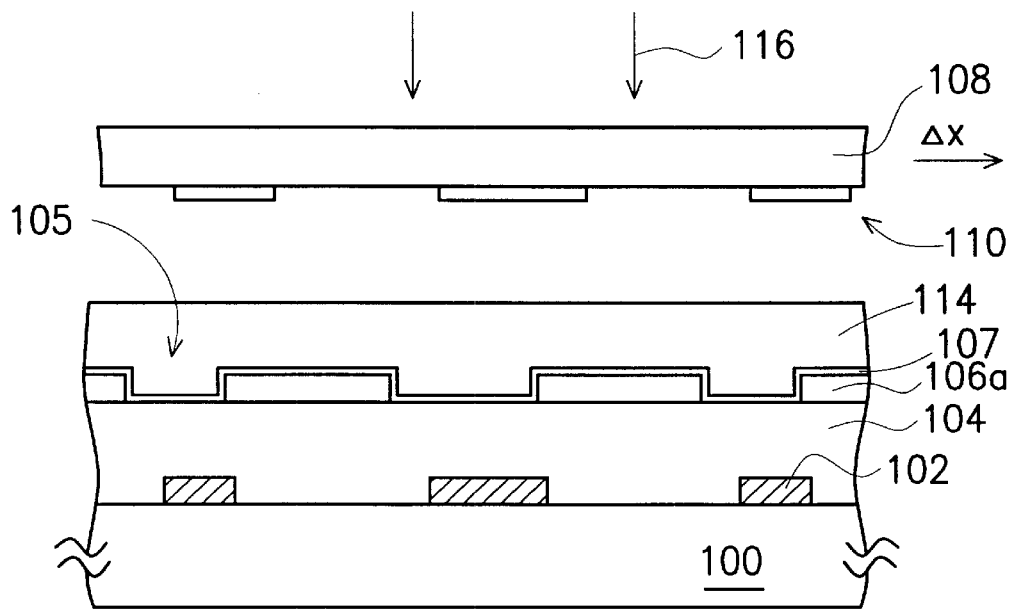

A photoresist layer 106 is formed over the dielectric layer. The photoresist layer 106 can be a negative photoresist layer or a positive photoresist layer. Preferably, the photoresist layer 106 is a deep ultraviolet (DUV) photoresist layer. In this embodiment, a negative photoresist is used as an illustration. A photomask 108 having an opening pattern 110 thereon is used to conduct a photo-exposure 112 so that the opening pattern 110 is transferred to the photoresist layer 106. After photoresist development, the photoresist layer 106 is converted to a photoresist layer 106a having an opening 105 therein (as shown in FIG. 1B). The photomask can be a clear field mask or a dark field mask. In this embodiment, a clear field mask is used in the illustration.

The patterned photoresist layer 106 is formed by first performing a soft baking. Soft baking serves to remove solvent contained within the photoresist and increases the adhesion of the photoresist and subsequent selectivity of the developing agent between exposed and unexposed photoresist material. Thereafter, photo-exposure 112 is conducted to transfer the opening pattern 110 on the photomask 108 to the photoresist layer 106. In the subsequent step, a post exposure baking is carried out and then the photoresist layer is developed to form the opening 105 that exposes a portion of the dielectric layer 104 in the photoresist layer 106. Ideally, only the light-exposed photoresist material in the negative photoresist layer 106 is retained after photoresist development.

As shown in FIG. 1B, a buffer layer 107 is formed over the substrate. The buffer layer can be, for example, a hydrophilic anti-reflection coating or a material layer having hydrophilic chemical structure.

Figure 1C:
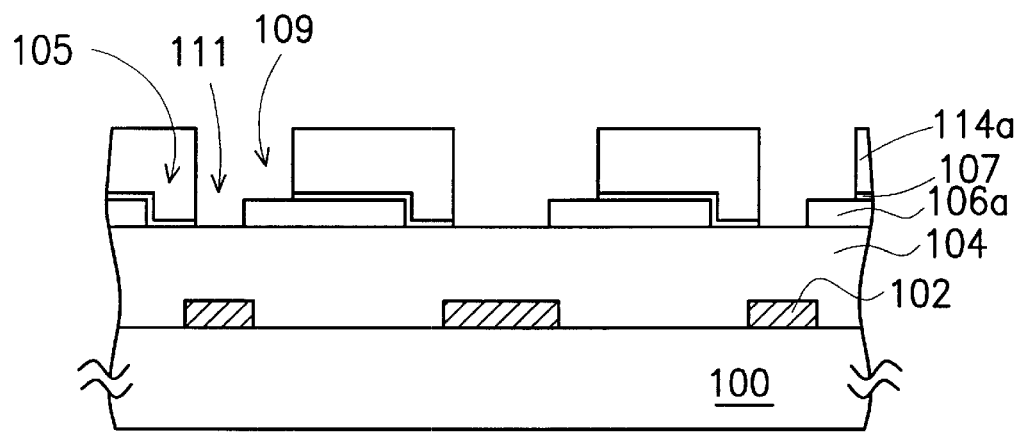

A photoresist layer 114 is formed over the buffer layer 107. The photoresist layer 114 can be a negative photoresist layer or a positive photoresist layer. Preferably, the photoresist layer 114 is a deep ultraviolet (DUV) layer. In this embodiment, the photoresist layer 114 is a negative photoresist layer. A horizontal shift of $\Delta x$ between photomask 108 and the substrate 100 is executed. A photo-exposure 116 is next carried out using the photomask 108 and then the exposed photoresist layer 114 is developed so that the photoresist layer 114 is converted into a photoresist layer 114a having an opening 109 thereon. The opening 109 exposes a portion of the photoresist layer 106a and a portion of the opening 105 (as shown in FIG. 1C). The horizontal shift $\Delta x$ is smaller than the dimension of the opening 105. Preferably, the horizontal shift $\Delta x$ is equal to half the width of the first opening 105.

The patterned photoresist layer 114a is formed, for example, by first carrying out a soft baking. A photo-exposure of the photoresist layer 114 is next carried out so that the opening pattern 110 on the photomask 108 is transferred to the photoresist layer 114. Thereafter, a post exposure bake is conducted and then the photoresist layer 114 is developed to form the photoresist layer 114a with an opening 109 therein. Since the buffer layer 107 is a hydrophilic material, the buffer layer 107 not covered by the photoresist layer 114a will be removed by the developing and rinsing agent in the photoresist layer 114 development process.

Because identical but slightly shifted opening patterns are formed on two different photoresist layers (106a and 114a), the opening 109 in the photoresist layer 114a only exposes a portion of the opening 105, the opening 111 shown in FIG. 1C. Hence, the original opening pattern 110 on the photomask 108 is slightly reduced after pattern transfer, thereby reducing the dimension of the ultimately formed contact opening. In particular, when the photoresist layers 106a and 114a are both deep ultraviolet photoresist layer, the contact opening can be reduced up to 0.1 $\mu$m.

Figure 1D:
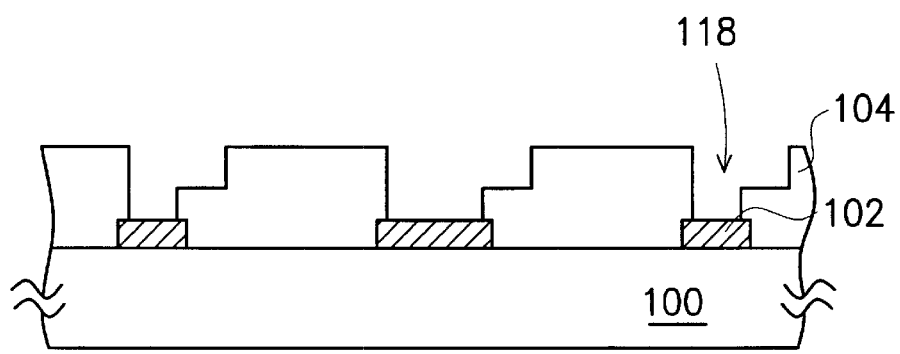

As shown in FIG. 1D, a portion of the dielectric layer 104 is removed using the photoresist layers 106a and 114a as a mask to form a contact opening 118 that exposes a portion of the conductive structure 102. Thereafter, the photoresist layers 106a and 114a are removed.

Figure 1E:
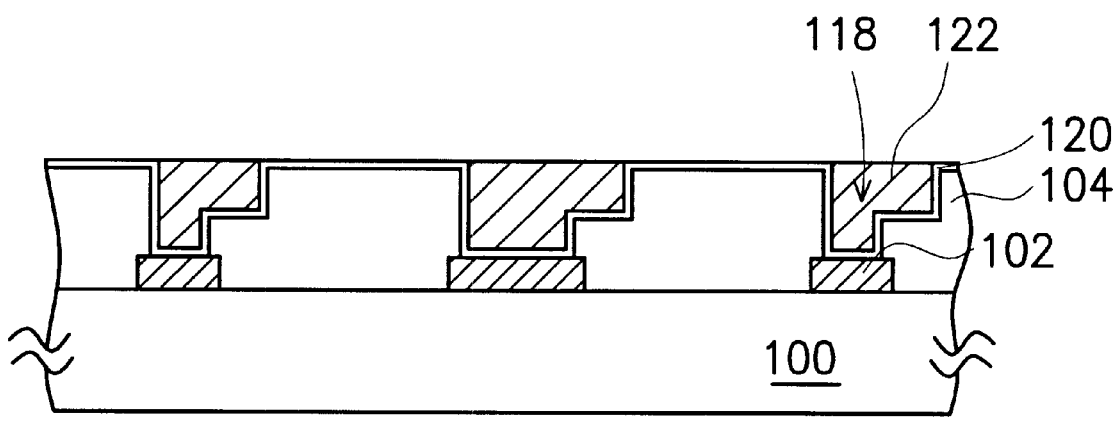

Referring to FIG. 1E, a glue layer 120 is formed over the substrate 100. The glue layer preferably includes but not limited to titanium/titanium nitride to increase an adhesion between the dielectric layer 104 and a metal plug formed subsequently. Then, the metal plug 122 is formed in the opening 118 to complete the manufacture of the contact window, wherein the metal plug 122 includes tungsten.

In this invention, photoresist patterns are stacked on top of each other. In other words, identical patterned photoresist layers (106a and 114a) with horizontal shifting relative to each other are sequentially formed on top of each another. Through a slight offsetting of the patterned photoresist layers, the opening (111) that exposes the dielectric layer (104) is smaller than the opening pattern (110) on the photomask (108). Hence, the ultimately formed contact opening can have a smaller dimension.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a contact opening, comprising the steps of:

providing a substrate having a conductive structure and a dielectric layer already formed thereon;

forming a first photoresist layer over the dielectric layer;

performing a first photo-exposure followed by a photoresist development operation using a photomask to transfer an opening pattern on the photomask to the first photoresist layer, thereby forming a first opening that exposes a portion of the dielectric layer in the first photoresist layer;

forming a second photoresist layer over the patterned first photoresist layer;

shifting the photomask horizontally a little relative to the substrate to form an offset so that a portion of the opening pattern on the photomask is on top of the first opening;

performing a second photo-exposure followed by a photoresist development operation using the shifted photomask to transfer the opening pattern on the photomask to the second photoresist layer, thereby forming a second opening that exposes a portion of the first photoresist layer in the second photoresist layer;

removing a portion of the dielectric layer using the first and the second photoresist layer as a mask until a contact opening that exposes a portion of the conductive structure is formed;

removing the first and the second photoresist layer;

forming a glue layer over the substrate; and filling the contact opening with a metal plug.

2. The method of claim 1, wherein the step of performing a first photo-exposure followed by a photoresist development operation further includes the substeps of:

performing a soft baking;

performing a photo-exposure;

performing a post exposure baking;

performing a photoresist development to form a first opening in the first photoresist layer.

3. The method of claim 1, wherein before the step of forming the second photoresist layer, further includes depositing a material to form a buffer layer.

4. The method of claim 3, wherein the buffer layer includes a hydrophilic anti-reflection coating.

5. The method of claim 3, wherein the buffer layer includes a material layer having a hydrophilic chemical structure.

6. The method of claim 1, wherein the step of shifting the photomask horizontally includes moving the photomask by an offset smaller the width of the opening.

7. The method of claim 1, wherein the step of shifting the photomask horizontally includes moving the photomask by an offset of about half of the width of the opening.

8. The method of claim 1, wherein the first photoresist layer includes a deep ultraviolet photoresist layer.

9. The method of claim 1, wherein the second photoresist layer includes a deep ultraviolet photoresist layer.

10. A method of forming a contact opening over a substrate having a conductive structure and a dielectric layer thereon, comprising the steps of:

forming a first photoresist layer over the dielectric layer;

performing a first photo-exposure followed by a photoresist development operation to form a first opening pattern that exposes a portion of the dielectric layer in the first photoresist layer;

forming a second photoresist layer over the patterned first photoresist layer;

performing a second photo-exposure followed by a photoresist development operation to form a second opening pattern that exposes a portion of the first photoresist layer and a portion of the first opening, wherein the second opening pattern is identical to the first opening pattern but the second opening pattern is shifted horizontally by an offset relative to the first opening pattern;

removing a portion of the dielectric layer using the first and the second photoresist layers as a mask to form a contact opening that exposes a portion of the conductive structure;

removing the first and the second photoresist layer;

forming a glue layer over the substrate; and filling the contact opening with a metal plug.

11. The method of claim 10, wherein the step of performing a first photo-exposure followed by a photoresist development operation further includes the substeps of:

performing a soft baking;

performing a photo-exposure;

performing a post exposure baking;

performing a photoresist development to form a first opening in the first photoresist layer.

12. The method of claim 10, wherein before the step of forming the second photoresist layer, further includes depositing a material to form a buffer layer.

13. The method of claim 12, wherein the buffer layer includes a hydrophilic anti-reflection coating.

14. The method of claim 12, wherein the buffer layer includes a material layer having a hydrophilic chemical structure.

15. The method of claim 10, wherein the offset of the second opening pattern relative to the first opening pattern is smaller than the width of the first opening.

16. The method of claim 10, wherein the offset of the second opening pattern relative to the first opening pattern is about half the width of the first opening.

17. The method of claim 10, wherein the first photoresist layer includes a deep ultraviolet photoresist layer.

18. The method of claim 10, wherein the second photoresist layer includes a deep ultraviolet photoresist layer.

* * * * *